United States Patent
Van Boxtel et al.

(10) Patent No.: US 8,988,657 B2
(45) Date of Patent: Mar. 24, 2015

(54) LITHOGRAPHIC APPARATUS AND DEVICE MANUFACTURING METHOD

(75) Inventors: Frank Johannes Jacobus Van Boxtel, Eindhoven (NL); Jeroen Gerard Gosen, Geldrop (NL); Anthonie Kuijper, Best (NL); Arjan Hubrecht Josef Anna Martens, Valkenburg (NL); Jean-Philippe Xavier Van Damme, Wezembeek-Oppem (BE); Peter Schoenmakers, Boxtel (NL); Franciscus Joannes Anthonius Evers, Selfkant-Mille (DE); Jaap Wilhelmus Petrus Van Empel, Bergeijk (NL); Léon Hubert Joseph Coumans, Schinnen (NL); Justin Johannes Hermanus Gerritzen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 171 days.

(21) Appl. No.: 13/541,300

(22) Filed: Jul. 3, 2012

(65) Prior Publication Data

US 2013/0010270 A1    Jan. 10, 2013

Related U.S. Application Data

(60) Provisional application No. 61/505,763, filed on Jul. 8, 2011.

(51) Int. Cl.
*G03F 7/20* (2006.01)

(52) U.S. Cl.
CPC ........ *G03F 7/70716* (2013.01); *G03F 7/70933* (2013.01); *G03F 7/70866* (2013.01); *G03F 7/70916* (2013.01)
USPC .......... 355/75; 355/30; 310/12.06; 310/12.29

(58) Field of Classification Search
CPC . G03F 7/70716; G03F 7/708; G03F 7/70808; G03F 7/70816; G03F 7/70858–7/70891; G03F 7/70933; H01L 21/68; H01L 21/682
USPC ............. 310/12.05, 12.06, 12.29; 355/30, 72, 355/73, 75, 76
See application file for complete search history.

(56) References Cited

U.S. PATENT DOCUMENTS

| | | | |
|---|---|---|---|
| 6,987,278 B2 | 1/2006 | Loopstra | |
| 7,253,875 B1 * | 8/2007 | Luttikhuis et al. | 355/30 |
| 2001/0026355 A1 * | 10/2001 | Aoki et al. | 355/30 |
| 2001/0038442 A1 * | 11/2001 | Hansell et al. | 355/30 |
| 2002/0045113 A1 | 4/2002 | Pril et al. | |

(Continued)

FOREIGN PATENT DOCUMENTS

| | | |
|---|---|---|
| CN | 101403861 | 4/2009 |
| CN | 101452218 | 6/2009 |
| EP | 1 326 139 | 7/2003 |
| JP | 2000-087746 | 3/2000 |

(Continued)

*Primary Examiner* — Colin Kreutzer
(74) *Attorney, Agent, or Firm* — Pillsbury Winthrop Shaw Pittman LLP (57) ABSTRACT

A lithographic apparatus having a component that moves in a first direction, the component including a passive gas flow system. The passive gas flow system has a gas inlet to drive gas into the passive gas flow system when the component moves in the first direction and a gas outlet, connected to the gas inlet by a gas conduit, to direct the gas that is driven into the passive gas flow system in a certain direction.

19 Claims, 4 Drawing Sheets

(56) References Cited

U.S. PATENT DOCUMENTS

| | | | |
|---|---|---|---|
| 2002/0057423 A1* | 5/2002 | Nogawa | 355/30 |
| 2003/0006380 A1 | 1/2003 | Van Empel et al. | |
| 2003/0146396 A1 | 8/2003 | Loopstra | |
| 2006/0209274 A1 | 9/2006 | To et al. | |
| 2009/0207394 A1* | 8/2009 | Shibazaki | 355/53 |
| 2011/0228239 A1 | 9/2011 | Gosen et al. | |

FOREIGN PATENT DOCUMENTS

| | | |
|---|---|---|
| JP | 2000-175434 | 6/2000 |
| JP | 2001-168027 | 6/2001 |
| JP | 2001-210587 | 8/2001 |
| JP | 2002-110538 | 4/2002 |
| JP | 2004-214552 | 7/2004 |
| WO | 2009/078422 | 6/2009 |

* cited by examiner

LITHOGRAPHIC APPARATUS AND DEVICE MANUFACTURING METHOD

This application claims priority and benefit under 35 U.S.C. §119(e) to U.S. Provisional Patent Application No. 61/505,763, filed on Jul. 8, 2011. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An internal gaseous environment in the region of the patterning device may be controlled to prevent contaminants and/or gas (e.g., air) with a variable property from interfering with the radiation beam and/or a sensitive element of the patterning device. The internal gaseous environment will typically be substantially isolated from the region outside, but not perfectly sealed off. A gas supply system having an outlet into the internal gaseous environment may be provided and configured to maintain an overpressure in the internal gaseous environment. The overpressure may drive a constant flow of gas out of the internal gaseous environment. The constant outward flow of gas may help to prevent inflow of contaminants. The constant flow of gas may be channeled through a leaky seal, for example through opposed flow-restricting surfaces.

A support for the patterning device may predominantly be configured to be driven linearly in a certain direction (and thus predominantly drive the patterning device in the direction). The direction may be perpendicular to the axis of the projection system, which is referred to as the Z-axis. The direction may be referred to as the Y-direction.

SUMMARY

Movement of the patterning device support may increase the level of contamination of the internal gaseous environment. For example, movement of the support can increase the extent to which contaminants breach the seal provided by the opposed flow-restricting surfaces. Movement of the support may lead to undesirable variation in the gaseous environment outside the internal gaseous environment. Such variation may interfere with a device to measure the position of the support. A flow-restricting surface to control the flow of gas out of the internal gaseous environment may contribute to overheating of a magnet system to drive movement of the support.

It is desirable, for example, to provide an arrangement which addresses at least one of the above-described problems, or other problems, associated with movement of the support.

According to an aspect of the invention, there is provided a lithographic apparatus, comprising a component configured to be moved in at least a first direction during use of the lithographic apparatus, the component including a passive gas flow system comprising:

a gas inlet configured such that, when the component moves in the first direction, the movement of the component in the first direction drives gas into the passive gas flow system; and a gas outlet, connected to the gas inlet by a gas conduit, configured to direct gas, that is driven into the passive gas flow system by the movement of the component in the first direction, in a certain direction relative to the component.

According to an aspect of the invention, there is provided a device manufacturing method, comprising using a lithographic apparatus to transfer a pattern from a patterning device to a substrate, the method further comprising:

moving a component of the lithographic apparatus in a first direction, the component comprising a passive gas flow system;

as the component moves in the first direction, driving gas, by virtue of the movement of the component, into the passive gas flow system via a gas inlet; and passing the gas driven into the gas inlet through a gas conduit in the passive gas flow system to a gas outlet which directs the gas in a certain direction relative to the component.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
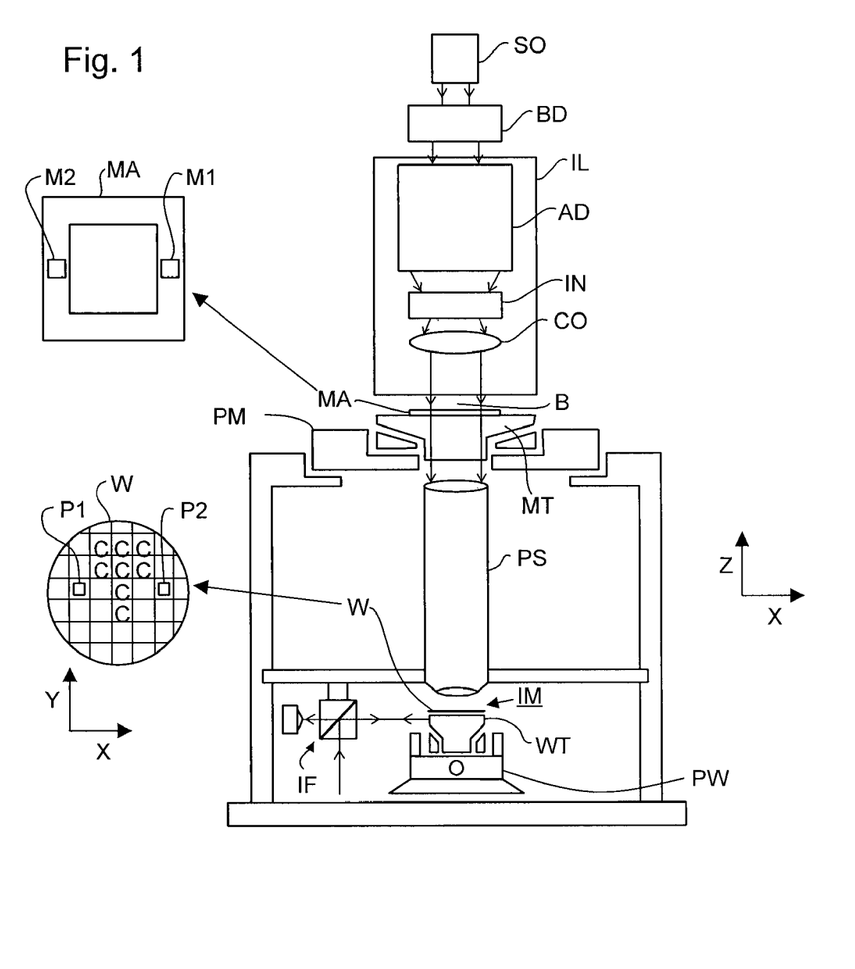
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, catadioptric, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g. two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning devices (or stages or supports) which may be used in parallel in a similar manner to substrate, sensor and measurement tables.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not exclusively mean that a structure, such as a substrate, must be submerged in liquid, but rather that liquid can be located between the projection system and the substrate and/or mask during exposure. This may or may not involve a structure, such as a substrate, being submerged in liquid. Reference sign IM shows where apparatus for implementing an immersion technique may be located. Such apparatus may include a supply system for the immersion liquid and a seal member for containing the liquid in the region of interest. Such apparatus may optionally be arranged so that the substrate table is fully covered by the immersion liquid.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, as in other modes, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
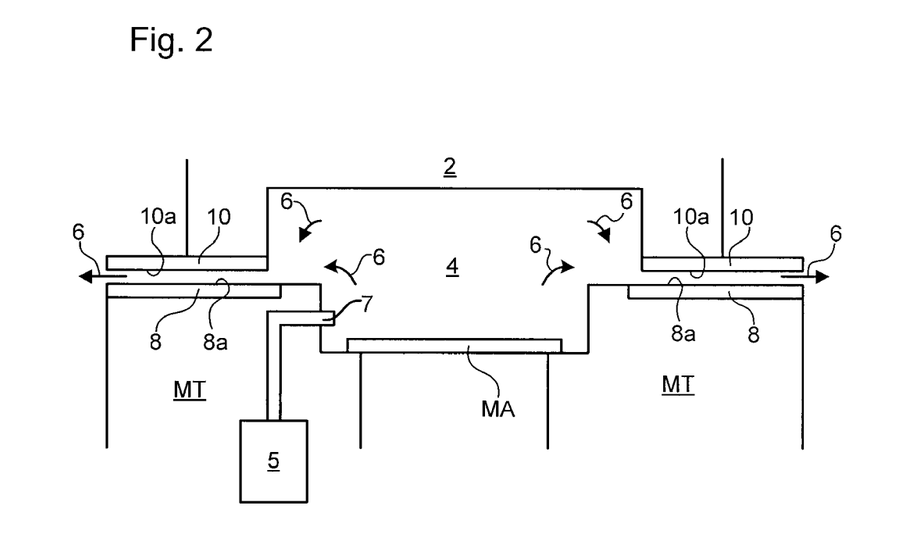
FIG. 2 depicts an internal gaseous environment and first and second planar elements on an upper side of the support for the patterning device.

As mentioned above, it may be desirable to maintain a controlled internal gaseous environment in the region of the patterning device MA (above and/or below the patterning device MA). FIG. 2 depicts an arrangement, depicting in general how control of an internal gaseous environment 4 can be achieved in a region above, for example, the support MT. It should be appreciated that such an internal gaseous environment may desirably also be provided in other parts of a lithographic apparatus, for example in the region of the substrate table, or a part thereof. For example, it may be desirable to control a gaseous environment around a sensor such as a position sensor. It will be appreciated that an embodiment of the invention described herein may therefore be used in such other contexts, namely is not limited to the contexts used herein to describe an embodiment of the invention.

The internal gaseous environment 4 in this example is located between the patterning device MA and support MT on one side, and a final element (and surrounding hardware) 2 of the illumination system IL on the other side. The internal gaseous environment 4 depicted is thus a volume through which the radiation beam will pass before it encounters the patterning device MA.

In this example, a gas supply system 5 is provided to supply gas via an outlet 7 to the internal gaseous environment 4. The gas may be supplied with a controlled composition and/or at a controlled flow rate. Optionally, an overpressure is maintained within the internal gaseous environment 4. The overpressure results in an outward flow of gas, as shown schematically by arrows 6. The gas supply system 5 and/or outlet 7 may be mounted within the patterning device support MT (as shown) and/or within an element above and/or below the patterning device support MT. For example, the gas supply system 5 and/or outlet 7 may be mounted within a final element 2 of the illumination system IL. Alternatively or additionally, the gas supply system 5 and/or outlet 7 may be mounted within a first element 3 of the projection system PS.

The spatial distribution of flows/velocities can be controlled by first and second planar elements 8, 10. The first planar element 8 is such as to present a first flow-restricting surface 8*a*. The second planar element 10 is such as to present a second flow-restricting surface 10*a*. The planar elements 8, 10 are typically configured such that the first and second flow-restricting surfaces 8*a*, 10*a* are generally planar, i.e. planar within standard engineering tolerances and disregarding deliberately formed projections and/or recesses that may be provided in order to restrict further the gas flow between the flow restriction surfaces 8*a*, 10*a*. Either or both of the planar elements 8, 10 may be formed as a separate element, for example as a plate, and attached to a component of the lithographic apparatus (e.g. the support MT in the case of the first planar element 8). Alternatively or additionally, either or both of the planar elements 8, 10 may be formed as an integral part of another component. Either or both of the planar elements 8, 10 may comprise two substantially parallel, planar surfaces that are spaced apart from each other parallel to the Z-axis. Alternatively, either or both of the planar elements 8, 10 may comprise only a single planar surface (which would be the flow-restricting surface 8*a*, 10*a* in this case).

The flow-restricting surfaces 8*a*, 10*a* face each other and are configured to resist inward and outward gas flow through the gap between them. Resisting inward gas flow helps to reduce contamination of the internal gaseous environment 4. Resisting outward gas flow helps the gas supply system 5 maintain a substantially stable overpressure in the internal gaseous environment 4. The flow-restricting surfaces 8*a*, 10*a* also present a relatively small gap through which the outflow of gas must pass. This results in an increase in velocity of the outflow of gas. The increase in velocity counters diffusion of contaminants inwards. Also a higher outflow velocity is beneficial for the following reason. When the patterning device support MT is moved along the Y direction in a first sense, it creates a lower pressure region in its wake, which tends to be filled by environmental gas (which it is desirable to keep out of the internal gaseous environment). When the patterning device support MT then scans back in the second, opposite sense of the Y direction, it is desirable that the output velocity should be higher at least than the scan speed of the patterning device support MT (and desirably higher than the scan speed plus the maximum velocity of inflow of environmental gas into the lower pressure region) in order to reduce, minimize or completely avoid significant inflow of the environment gas into the internal gaseous environment.

The flow-restricting surfaces 8a, 10a may be arranged to be substantially parallel to each other. The spacing between the flow-restricting surfaces 8a, 10a should be small enough to provide the desired level of outflow velocity for a given supply of gas via the gas supply system 5 and/or outlet 7 used to establish the overpressure in the internal gaseous environment 4.

Figure 3:
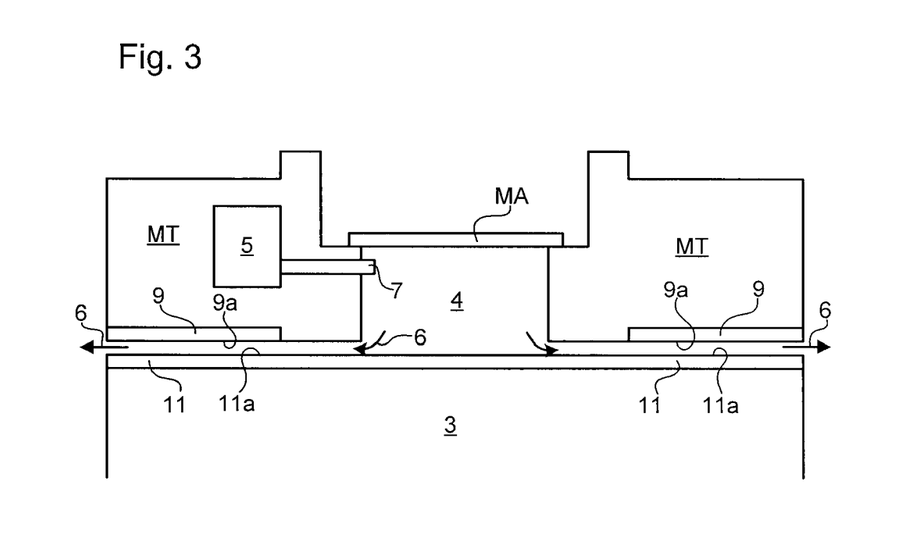
FIG. 3 depicts an internal gaseous environment and first and second planar elements on a lower side of the support.

FIG. 3 depicts an arrangement corresponding to the arrangement of FIG. 2 except that the internal gaseous environment 4 is located below the patterning device MA. The internal gaseous environment 4 depicted is thus a volume through which the radiation beam will pass after it has encountered the patterning device MA. The internal gaseous environment 4 is contained by the support MT and patterning device MA on one side and by a first element (and surrounding hardware) 3 of the projection system PS on the other side. The support MT in this example comprises a first planar element 9 formed in a lower portion thereof. The first planar element 9 has a first flow-restricting surface 9a. The first element of the projection system PS has a second planar element 11 attached to an upper surface thereof. The second planar element 11 has a second flow-restricting surface 11a. The second flow-restricting surface 11a is configured to face the first flow-restricting surface 9a. Either or both of the planar elements 9, 11 may comprise two substantially parallel, planar surfaces that are spaced apart from each other parallel to the Z-axis. Alternatively, either or both of the planar elements 9, 11 may comprise only a single planar surface (which would be the flow-restricting surface 9a, 11a in this case). As with the arrangement of FIG. 2 discussed above, the distribution of flows/velocities can be controlled by the arrangement of the first and second planar elements 9, 11.

In both the arrangement of FIG. 2 and the arrangement of FIG. 3, arrows 6 show schematically the flow of gas from the outlet 7 of the gas supply system 5 through a central region of the internal gaseous environment 4 and out through the gap between the flow-restricting surfaces 8a, 9a, 10a, 11a to the region outside the internal gaseous environment 4.

The internal gaseous environments 4 of FIGS. 2 and 3 are shown in separate locations. However, in an embodiment, the internal gaseous environments 4 are not isolated from each other. The internal gaseous environments 4 could be connected together. In this case, a single gas supply system 5 could be provided. The single gas supply system 5 could have a single outlet 7 either above or below the patterning device MA. Gas would be able to flow between the internal gaseous environment 4 above the patterning device MA and the internal gaseous environment 4 below the patterning device MA by one or more connections between the internal gaseous environment 4 above the patterning device MA and the internal gaseous environment 4 below the patterning device MA. Alternatively, the single gas supply system 5 could have a plurality of outlets 7 below, above, or below and above the patterning device MA.

In the example shown, the gas supply system 5 and outlet 7 are incorporated into the support MT. However, the gas supply system 5 and/or outlet 7 could be mounted to other components. For example, the gas supply system 5 and/or outlet 7 could be attached to the final element (or surrounding hardware) 2 of the illumination system IL and/or the first element (or surrounding hardware) 3 of the projection system PS.

Figure 4:
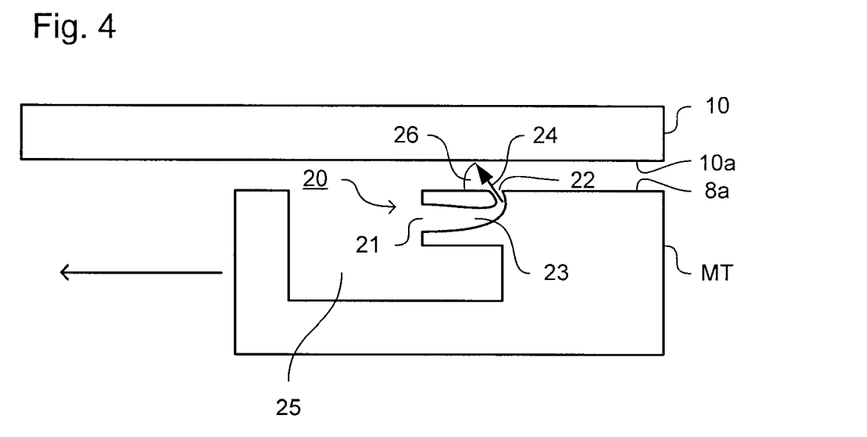
FIG. 4 depicts a system according to an embodiment of the invention.

FIG. 4 depicts schematically an embodiment of the invention applied to the edge of a patterning device support MT. As shown, a passive gas flow system 20 is provided, namely a system that has no active components to create a gas flow but which generates a flow of gas by the movement of the component to which it is mounted. The passive gas flow system 20 includes a gas inlet 21, a gas outlet 22 and a gas conduit 23 connecting the gas inlet 21 to the gas outlet 22.

The gas inlet 21 of the passive gas flow system 20 is configured such that, when the patterning device support MT to which it is mounted moves in a first direction, indicated by the arrow shown in FIG. 4, the movement of the patterning device support MT drives gas into the gas inlet 21. The gas that is driven into the gas inlet 21 of the passive gas flow system 20 is subsequently driven through the gas conduit 23 to the gas outlet 22. The gas outlet 22 of the passive gas flow system 20 is configured such that the gas that is driven through the passive gas flow system 20 by the movement of the patterning device support MT is provided as a gas flow 24 in a certain direction relative to the patterning device support MT.

In the embodiment depicted in FIG. 4, the gas outlet 22 is provided within the planar upper surface 8a of the patterning device support MT that forms one of a pair of flow-restricting surfaces 8a, 10a as described above. The gas outlet 22 may be configured such that the flow of gas 24 out of the gas outlet 22 is provided in a direction at an angle 26 selected from the range of approximately perpendicular to the surface 8a of the patterning device support MT and approximately 10° to the first direction, namely the direction of movement of the patterning device support MT that generates the gas flow. In an embodiment, the gas outlet 22 may be configured such that the flow of gas is provided in a direction selected from the range of from approximately perpendicular to the surface 8a to approximately 45° to the first direction.

Accordingly, the flow of gas 24 from the gas outlet 22 of the passive gas flow system 20 may be at least partially towards the first direction, namely at least partially opposed to the "head wind" that may be experienced by the edge of the patterning device support MT as it moves in the first direction. Therefore, the flow of gas 24 may reduce the likelihood of external gas passing between the pair of flow-restricting surfaces 8a, 10a towards the internal gaseous environment 4. However, the above-described arrangement is achieved without providing any active components. In particular, no additional gas supply may be required in order to provide the gas flow 24 outlet from the passive gas flow system 20. Accordingly, significant increase in the cost of goods of the lithographic apparatus and/or the cost of operation of the lithographic apparatus may be avoided.

In order to provide a desirable gas flow 24, the cross-sectional area of the gas outlet 22 of the passive gas flow system 20 may be smaller than the cross-sectional area of the gas inlet 21 of the passive gas flow system 20. In general, the smaller the cross-sectional area of the gas outlet 22 of the passive gas flow system 20 the higher the flow velocity of the output gas flow 24 that may be provided for a given speed of movement of the patterning device support MT. However, the smaller the cross-sectional area of the gas outlet 22 of the passive gas flow system 20, the smaller the total gas flow 24 may be for a particular speed of movement of the patterning device support MT. Accordingly, the selection of the size may be a compromise.

Similarly, the selection of the orientation of the gas outlet 22, namely the selection of the certain direction of the gas flow 24 output by the gas outlet 22 from within the range discussed above, may be a compromise. For example, the smaller the angle of the direction of the gas flow 24 outlet from the gas outlet 22 relative to the first direction, the more effective the gas flow 24 may be at preventing external gas from passing between the flow-restricting surfaces 8a, 10a to the internal gaseous environment 4. However, the smaller this angle, the smaller the gas flow 24 that may be generated for a particular speed of motion of the patterning device support MT.

As noted above, the gas flow 24 generated by the passive gas flow system 20 and output by the gas outlet 22 may be dependent on the speed of movement of the patterning device support MT. However, the need for this gas flow may also be dependent upon the speed of movement of the patterning device support MT. In particular, at lower speeds of the patterning device support MT, the likelihood of external gas passing between the flow-restricting surfaces 8a, 10a into the internal gaseous environment 4 is reduced. The gas flow 24 provided by the passive gas flow system 20 thus increases when it is desired, i.e. the solution scales with the problem.

As shown in FIG. 4, the gas inlet 21 of the passive gas flow system 20 may be arranged to face the direction of movement of the patterning device support MT. In particular, this may mean that a section of the gas conduit 23 immediately following the gas inlet 21 may be substantially parallel with the direction of movement of the patterning device support MT. This may increase or maximize the inflow of gas driven into the passive gas flow system 20 by the movement of the patterning device support MT.

In an embodiment, the gas inlet 21 may have an aperture that is substantially perpendicular to the direction of movement of the patterning device support MT.

In an arrangement, the gas inlet 21 may be provided on a leading edge of the patterning device support MT in order to face the first direction and have an unrestricted flow of gas into the passive gas flow system 20 when the patterning device support MT moves. However, this may not be possible. For example, an actuator system, not shown in FIG. 4, may be arranged at the leading edge. Accordingly, as shown in FIG. 4, a recess 25 may be provided in the surface 8a (which is parallel to a plane in which the direction of movement of the patterning device support MT lies) of the patterning device support MT and at least the gas inlet 21 of the passive gas flow system 20 may be provided within the recess 25. In particular, as depicted in FIG. 4, the gas inlet 21 may be provided on a wall of the recess 25 that is configured such that the gas inlet 21 may face the direction of movement of the patterning device support MT.

The recess 25 may not be solely provided in the surface 8a for the purpose of arranging the gas inlet 21. In other words, if the arrangement of the patterning device support MT includes such a recess 25 for some other purpose, optionally the gas inlet 21 may be conveniently located in such a recess.

The passive gas flow system 20 may be configured to provide the flow of gas 24 substantially along, or adjacent, one edge of the patterning device support MT, for example all along the leading edge as the patterning device support MT moves. Accordingly, the gas inlet 21 and/or the gas outlet 22 of the passive gas flow system 20 may be elongate in the direction of the edge of the patterning device support MT, namely perpendicular to the plane of FIG. 4. Alternatively or additionally, the gas inlet 21 and/or the gas outlet 22 of the passive gas flow system 20 may be formed from a plurality of apertures arranged along, or adjacent, the edge of the patterning device support MT.

In an arrangement, the gas outlet 22 may be configured such that the gas flow 24 from the gas outlet 22 when the patterning device support MT moves forms a gas knife.

Although the lithographic apparatus may be configured such that the patterning device support MT moves in the direction shown during use of the lithographic apparatus, it may be configured such that the patterning device support MT additionally moves in the opposite direction during use of the lithographic apparatus. In that case, the opposite side of the patterning device support MT may become the leading edge of the patterning device support MT during such movement. In particular, the patterning device support MT may reciprocate such that the two sides alternately become the leading edge.

In an embodiment, a second passive gas flow system 20 may be provided on the other side of the patterning device support MT (not shown in FIG. 4). The second passive gas flow system 20 may directly correspond to the passive gas flow system shown in FIG. 4, but be oriented in the opposite direction, namely such that, when the patterning device support MT moves in the opposite direction to that depicted in FIG. 4, gas is driven into the gas inlet of the second passive gas flow system, through a gas conduit and out from a gas outlet in a certain direction to provide a flow of gas that reduces the likelihood of external gas passing through into the gaseous environment 4.

As discussed above, an embodiment of the present invention may be used to provide a flow of gas to a boundary region of a space, such as that in which a particular gaseous environment 4 is to be provided, in order to reduce gas flow from outside of the space into the space at the boundary region. In particular, as described above, an embodiment of the present invention may be used to reduce or prevent the flow of external gas into a gaseous environment 4 in which the patterning device MA is to be provided. Additionally or alternatively, such an embodiment may be used in conjunction with a moving component of the lithographic apparatus other than the patterning device support MT in order to provide a flow of gas to assist in maintaining a specified gaseous environment in another region of the lithographic apparatus.

By way of example only, a passive gas flow system such as that discussed above may be provided to a substrate table WT such that the passive gas flow system provides a flow of gas when the substrate table is moved and may be configured to provide a flow of gas in a certain direction in order to assist in maintaining a desired gaseous environment around a sensor, such as a position sensor to monitor the position of the substrate table, or around the substrate W. As a further example, a passive gas flow system as describe herein may be used to assist in maintaining a desired gaseous environment around a measurement table.

Figure 5:
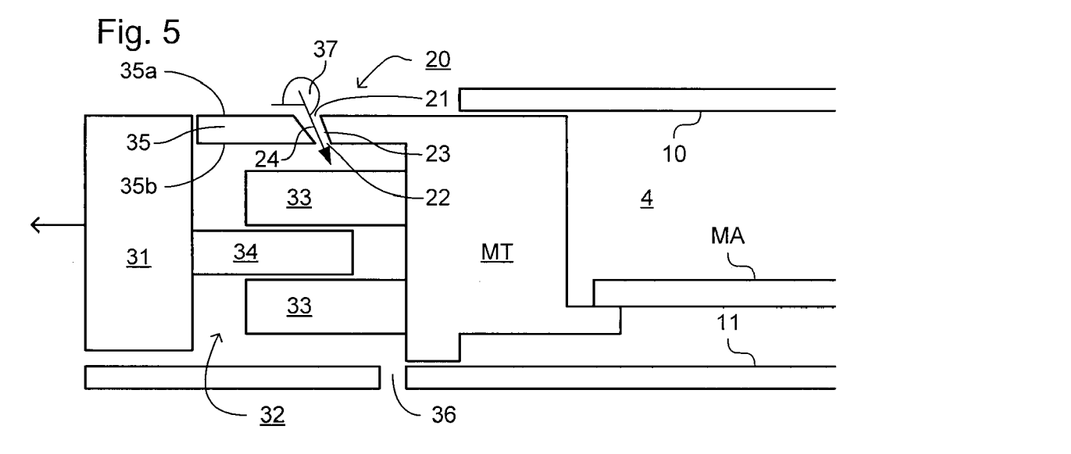
FIGS. 5 and 6 depict a further system, in accordance with an embodiment of the invention, in two different positions.

FIG. 5 depicts a further embodiment of the present invention. Again, the embodiment of FIG. 5 is depicted in the context of a moving patterning device support MT. Additionally or alternatively, such an embodiment may be applied in respect of another moving component within a lithographic apparatus.

FIG. 5 depicts a detail of the positioning system to move a patterning device support MT within the lithographic apparatus. Specifically, it depicts a long-stroke stage 31 that may be moved by a long-stroke actuator system (not depicted in FIG. 5) in order to provide coarse positioning of the patterning device support MT. Furthermore, a short-stroke actuator system 32 may be provided in order to provide fine positioning of the patterning device MT by adjusting its position relative to the long-stroke stage 31.

The short-stroke actuator system 32 may, for example as schematically depicted in FIG. 5, include one or more permanent magnets 33 mounted to the patterning device support MT and a coil 34 mounted to the long-stroke stage 31. During operation of the actuator system 32, heat may be generated in the coil 34. Accordingly, a cooling system may be provided within the long-stroke stage 31 in order to cool the coil 34. However, some heat may still be transferred to the magnet 33, which may result in an undesirable heat load on the patterning device support MT.

Therefore, in an embodiment depicted in FIG. 5, a passive gas flow system 20 may be provided in order to provide a flow of gas 24 onto the magnet 33 and/or the coil 34 in order to provide cooling.

In particular, as shown in FIG. 5, the passive gas flow system 20 may be provided within a plate 35 covering the space in which the short-stroke actuator system 32 is provided. It should be appreciated that, as depicted in FIG. 5, the plate 35 in which the passive gas flow system 20 is provided may be attached to the patterning device support MT. Alternatively, the plate 35 in which the passive gas flow system 20 is provided may be connected to the long-stroke stage 31.

As shown, the passive gas flow system 20 of this embodiment includes a gas inlet 21 provided in an upper surface 35a of the plate 35 that is oriented such that the direction in which the patterning device support MT moves in order to drive gas into the passive gas flow system 20 lies within a plane that is substantially parallel to the surface 35a. The gas outlet 22 of the passive gas flow system 20 may be provided in a lower surface 35b of the plate 35. The lower surface 35b of the plate 35 may be substantially parallel to the upper surface 35a of the plate. A gas conduit 23 may pass through the plate 35 in order to connect the gas inlet 21 to the gas outlet 22. As with the embodiment discussed above in connection with FIG. 4, the passive gas flow system 20 may be configured such that the cross-sectional area of the gas outlet 22 is smaller than that of the gas inlet 21 in order to provide a desired gas flow 24. In an embodiment, the cross-sectional area of the gas outlet 22 may be as large or larger than that of the gas inlet 21.

Furthermore, as with the embodiment discussed above in relation to FIG. 4, the passive gas flow system 20 depicted in FIG. 5 may extend substantially along the full length of one side of the patterning device support MT. For example, the gas inlet 21 and/or the gas outlet 22 may include an elongate aperture. Accordingly, the passive gas flow system 20 of this embodiment may, for example, have the form of an elongate slit.

In an arrangement, the gas conduit 23 may be provided in a straight line through the plate 35. In an arrangement, the gas flow system 20 may be configured to provide the gas flow 24 at an angle 37 selected from the range of approximately 185° to approximately 225°, or from the range of approximately 185° to approximately 205° relative to the direction of movement of the patterning device support MT. The angle may be selected to optimize the gas flow through the passive gas flow system 20 and/or to control the direction of the gas flow 24 output by the passive gas flow system. If the cross-sectional area of the gas outlet 22 is smaller than the cross-sectional area of the gas inlet 21, the side walls of the gas conduit 23 may not be parallel.

In order to help ensure that gas that is driven onto the magnet 33 and/or coil 34 by the passive gas flow system 20 does not result in a gas flow to an undesirable part of the lithographic apparatus, a vent 36 may be provided in order to direct exhaust gas in a desired direction. In particular, as depicted in FIG. 5, the space in which a gaseous environment surrounding the patterning device MA and/or in which the short-stroke actuator system 32 is provided may be bounded on one side by a planar element 11 such as that discussed above. In such an arrangement, the vent 36 may be provided within the planar element 11.

Figure 6:
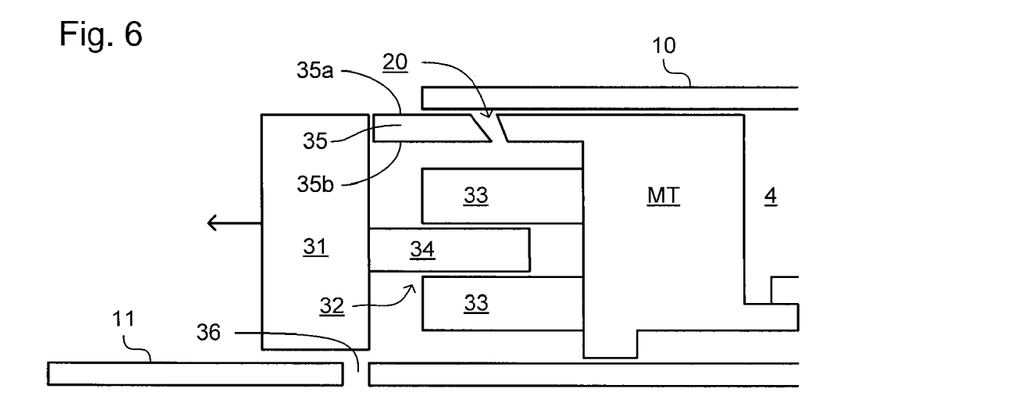

In an arrangement, the vent 36 may be positioned such that as the patterning device support MT is moved relative to the planar element 11, the space surrounding the short-stroke actuator system 32 is only connected to the vent 36 when gas is driven into the space by the passive gas flow system 20 provided in the plate 35 covering the short-stroke actuator system 32 as shown in FIG. 5. In another position, for example as shown in FIG. 6, the patterning device support MT may be initially positioned relative to the planar element 11 discussed above in a position in which the gas inlet 21 of the passive gas flow system 20 in the plate 35 is opposite a planar element 10. In this position, the path of least resistance for gas flow caused by the movement of the patterning device support MT may be through the space around the short-stroke actuator system 32. This gas may exhaust through a space between the long-stroke stage 31 and the planar element 11, which may be wider than the space between the patterning device support MT and the planar element 11, reducing the likelihood of significant gas flow through the latter space. In the position depicted in FIG. 6, the space around the short-stroke actuator system 32 may not be connected to the vent 36. This may increase the pressure within the space, resulting in an increased gas flow when it connects to the vent 36 after the patterning device support MT has moved to the position shown in FIG. 5.

In any case, the vent 36 may be positioned to help ensure that any gas flow through the vent 36 is not directed onto any critical component. Such a component may be affected by contaminants in the gas flow and/or a temperature change caused by the gas flow.

In an embodiment, if the passive arrangements discussed above to exhaust the gas from the space around the short-stroke actuator system 32 provided by the passive gas flow system 20 are not sufficient, an active exhaust may be provided. For example the space may be connected to a suitable underpressure source.

As with the embodiment as discussed above in relation to FIG. 4, a passive gas flow system 20 as described above in relation to FIGS. 5 and 6 may be provided on both sides of the patterning device support MT in order to provide a cooling flow to the short-stroke actuator system 32 that may be provided on either side of the patterning device support MT. In the context of this embodiment, it may alternatively or additionally be desirable to provide a flow of gas 24 to the short-stroke actuator system 32 on one side of the patterning device support MT both when it is traveling in one scanning direction, such as that depicted in FIG. 5 and when it is traveling in the opposite direction.

Therefore, in an arrangement, the plate 35 provided on one side of the patterning device support MT may include two passive gas flow systems 20, oriented in opposite directions but both providing a flow of gas onto the magnet and/or coil on one side of the patterning device support MT. That is, when the patterning device support MT moves in a first direction, gas is driven into the gas inlet 21 of a first passive gas flow system, and, when the patterning device support MT moves in the opposite direction, the movement drives gas into the gas inlet 21 of the other passive gas flow system 20. Accordingly, movement of the patterning device support MT in either direction drives a flow of gas 24 onto the magnet 33 and/or coil 34 of the short-stroke actuator system 32 on one side of the patterning device support MT.

On one or both sides of the patterning device support MT, two or more passive gas flow systems 20 such as those described herein may be provided that are oriented in the same direction. The provision of more than one passive gas flow system 20 oriented in the same direction may be used to create an additional gas flow for a particular direction of movement of the patterning device support MT compared with an arrangement with a single passive gas flow system 20.

Alternatively or additionally a passive gas flow system described herein may be used to provide a flow of gas to one or more other components in the lithographic apparatus that may require cooling. For example, it may be used to provide a cooling flow to a unit containing electronics that may generate heat in use and/or may be used to provide a cooling gas flow to part or all of an actuator system of the long-stroke stage and/or short-stroke and long-stroke stages of a substrate table WT and/or a measurement table.

Figure 7:
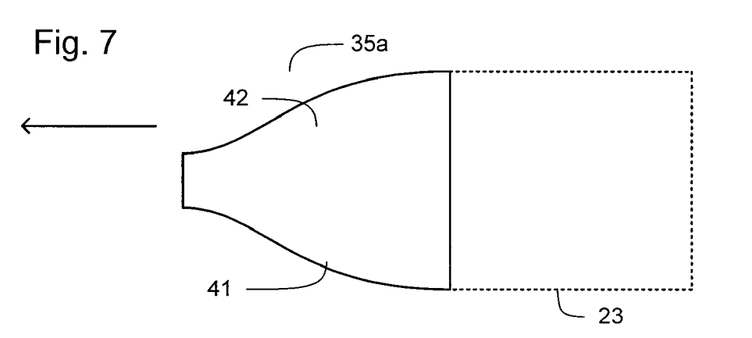
FIGS. 7-9 depict details of gas inlets that may be used with an embodiment of the present invention.
Figure 8:
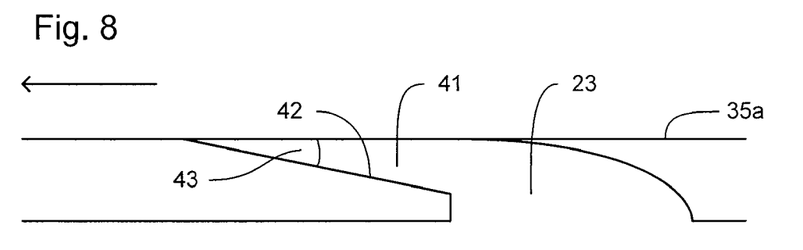

In a variant of the arrangement discussed above with reference to FIGS. 5 and 6, a passive gas flow system 20 may include one or more submerged inlets provided in the surface 35a of the plate 35. FIGS. 7 and 8 depict, in plan view and cross-section respectively, a possible arrangement of such a submerged inlet, also known as a NACA duct.

As shown, such an inlet includes a recess 41 having a sloped surface 42. The sloped surface 42 connects with the surface 35a in which the inlet is formed at an upstream end of the inlet, namely at the end of the inlet towards which the plate 35 is traveling. The angle 43 of the slope relative to the surface 35a in which the inlet is formed is selected to maximize the extent to which the gas is drawn into the inlet. Typically the angle 43 of the sloped surface 42 relative to the surface 35a in which the inlet is formed may be selected from the range of from approximately 1° to approximately 15°, or from the range of approximately 5° to approximately 10°.

As shown in FIG. 7, the width of the recess 41 increases from the shallowest end of the recess 41 to the opposite end of the recess, channeling the gas that is drawn into the recess 41 into the gas conduit 23. As shown in FIGS. 7 and 8, the edges of the recess 41 are curved in order to minimize the disruption of the gas flow.

Figure 9:
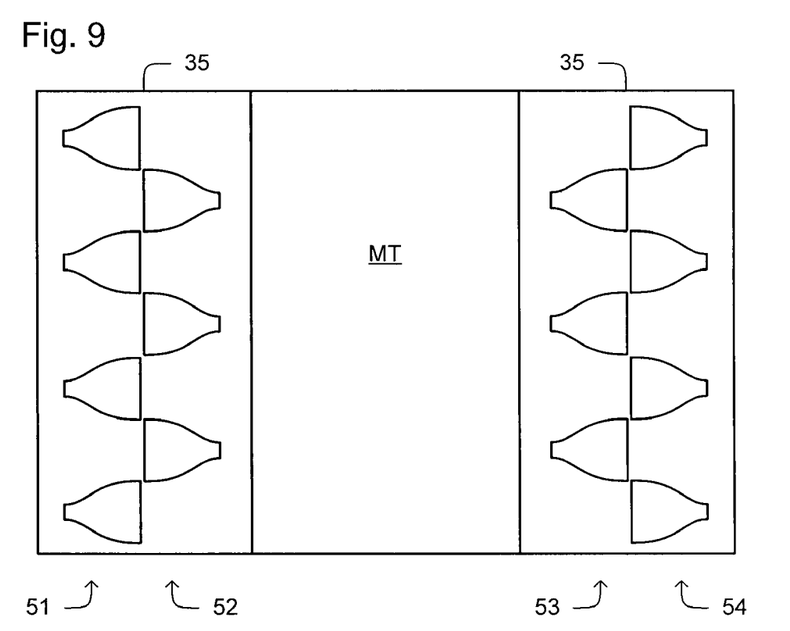

The submerged inlets discussed above may not be suitable for use as a single elongate gas inlet to the passive gas flow system 20 provided along one edge of the patterning device support MT. Accordingly, as depicted in FIG. 9, a plurality of submerged inlets may be arranged in a row 51 in the surface of the plate 35 provided along one edge of the patterning device support MT. Conveniently, as shown, a second row 52 of submerged inlets of this type may be interlaced with the first row 51 but oriented in the opposite direction, namely in order to provide a gas flow through the covering plate 35 when the patterning device support MT moves in the opposite direction as discussed above.

As also discussed previously, corresponding arrangements may be provided on the opposite side of the patterning device support MT in order to provide a cooling gas flow to the short-stroke actuator system on the opposite side of the patterning device support MT. In particular, third and fourth rows 53, 54 of submerged inlets arranged in opposite orientations to each other may be provided.

The submerged inlets discussed above with reference to FIGS. 7 to 9 may be used with an embodiment of the present invention such as that depicted in FIG. 4. For example, the submerged inlets may be provided in the upper surface 8a of the patterning device support MT and connected via gas conduits to the gas outlets 22 of the passive gas flow system described in conjunction with FIG. 4. In such an arrangement, in contrast with that depicted in FIG. 4, the gas inlets of the passive gas flow system 20 need not be provided within a recess 25.

Furthermore, a lithographic apparatus may include two or more of the arrangements of a passive gas flow system disclosed in this application. For example a patterning device support MT may include both an arrangement such as that depicted in FIG. 4 and an arrangement such as that depicted in FIGS. 5 and 6, either or both optionally including the variations described with reference to FIGS. 7 to 9.

In an embodiment, there is provided a lithographic apparatus, comprising: a component configured to be moved in at least a first direction during use of the lithographic apparatus, the component including a passive gas flow system comprising: a gas inlet configured such that, when the component moves in the first direction, the movement of the component in the first direction drives gas into the passive gas flow system; and a gas outlet, connected to the gas inlet by a gas conduit, configured to direct gas, that is driven into the passive gas flow system by the movement of the component in the first direction, in a certain direction relative to the component.

In an embodiment, the gas outlet is provided on a surface of the component, the surface oriented such that the first direction lies within a plane substantially parallel to the surface. In an embodiment, the gas outlet is configured such that the gas that is driven through the passive gas flow system forms a gas knife. In an embodiment, the gas outlet is configured such that the gas exits the gas outlet in a direction that is selected from the range of approximately perpendicular to the first direction to approximately 10° to the first direction, or from the range of approximately perpendicular to the first direction to approximately 45° to the first direction. In an embodiment, the passive gas flow system is configured to provide a flow of gas to a boundary region of a space in a direction that is selected to reduce gas flow from outside of the space into the space at the boundary region. In an embodiment, the gas inlet has an elongate shape and is arranged such that the direction in which the gas inlet is elongate is substantially perpendicular to the first direction. In an embodiment, the passive gas flow system comprises a plurality of gas inlets, arranged in a row aligned substantially perpendicular to the first direction. In an embodiment, the gas inlet faces the first direction. In an embodiment, the component comprises a surface oriented such that the first direction lies within a plane substantially parallel to the surface; the surface includes a recess; and the gas inlet is arranged within the recess. In an embodiment, the gas outlet is provided on the same surface of the component as the recess in which the gas inlet is provided. In an embodiment, the component comprises a surface oriented such that the first direction lies within a plane substantially parallel to the surface; and the gas inlet is provided in the surface. In an embodiment, the gas inlet includes a recess in the surface. In an embodiment, the recess includes an inlet surface that joins the surface of the component at an end of the inlet that is the furthest part of the recess in the first direction and is at an angle to the surface of the component selected from the range of approximately 1° to approximately 15°, or from the range of approximately 5° to approximately 10°. In an embodiment, the width of the recess, measured in a direction that is perpendicular to the first direction and lies within the plane parallel to the surface of the component, increases in a direction opposite to the first direction. In an embodiment, the component comprises a cover plate, arranged to cover a part of the component and arranged such that an outer surface and an inner surface of the cover plate are oriented such that the first direction lies within a plane parallel to the outer and inner surfaces; the gas inlet is provided in the outer surface of the cover plate; and the gas outlet is provided in the inner surface of the cover plate. In an embodiment, the passive gas flow system comprises a straight gas conduit through the cover plate from the gas inlet to the gas outlet, and arranged such that the passive gas flow system provides a gas flow at an angle relative to the first direction selected from the range of approximately 185° to approximately 225°, or from the range of approximately 185° to approximately 205°. In an embodiment, the passive gas flow system is configured to provide a flow of gas towards a part of the component. In an embodiment, the component is a moveable stage configured to support an object in the lithographic apparatus and the passive gas flow system is configured to provide a flow of gas towards an actuator. In an embodiment, the component is also configured such that it can be moved in a second direction, opposite to the first direction, during use of the lithographic apparatus; and the component includes a second passive gas flow system comprising: a gas inlet configured such that, when the component moves in the second direction, the movement of the component in the second direction drives gas into the second passive gas flow system; and a gas outlet, connected to the gas inlet by a gas conduit, configured to direct gas, that is driven into the second passive gas flow system by movement of the component in the second direction, in a certain direction relative to the component. In an embodiment, the lithographic apparatus further comprises an additional passive gas flow system comprising: a gas inlet configured such that, when the component moves in the first direction, the movement of the component in the first direction drives gas into the additional passive gas flow system; and a gas outlet, connected to the gas inlet by a gas conduit, configured to direct gas, that is driven into the additional passive gas flow system by the movement of the component in the first direction, in a certain direction relative to the component.

In an embodiment, there is provided a device manufacturing method, comprising using a lithographic apparatus to transfer a pattern from a patterning device to a substrate, the method further comprising: moving a component of the lithographic apparatus in a first direction, the component comprising a passive gas flow system; as the component moves in the first direction, driving gas, by virtue of the movement of the component, into the passive gas flow system via a gas inlet; and passing the gas driven into the gas inlet through a gas conduit in the passive gas flow system to a gas outlet which directs the gas in a certain direction relative to the component.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before and/or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 355, 248, 193, 157 or 126 nm) and extreme ultraviolet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, catadioptric, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a component configured to be moved in at least a first direction during use of the lithographic apparatus, the component including a passive gas flow system comprising:
   a gas inlet configured such that, when the component moves in the first direction in a non-vertical plane, the movement of the component in the first direction drives gas into the passive gas flow system; and
   a gas outlet, connected to the gas inlet by a gas conduit, configured to direct gas, that is driven into the passive gas flow system by the movement of the component in the first direction, in a direction that is selected from the range of approximately perpendicular to the plane to approximately 10° to the first direction and to the plane.

2. The lithographic apparatus according to claim 1, wherein the gas outlet is provided on a surface of the component, the surface oriented such that the first direction lies within a plane substantially parallel to the surface.

3. The lithographic apparatus according to claim 1, wherein the gas outlet is configured such that the gas that is driven through the passive gas flow system forms a gas knife.

4. The lithographic apparatus according to claim 1, wherein the passive gas flow system is configured to provide a flow of gas to a boundary region of a space in a direction that is selected to reduce gas flow from outside of the space into the space at the boundary region.

5. The lithographic apparatus according to claim 1, wherein the gas inlet has an elongate shape and is arranged such that the direction in which the gas inlet is elongate is substantially perpendicular to the first direction.

6. The lithographic apparatus according to claim 1, wherein the passive gas flow system comprises a plurality of gas inlets, arranged in a row aligned substantially perpendicular to the first direction.

7. The lithographic apparatus according to claim 1, wherein the gas inlet faces the first direction.

8. The lithographic apparatus according to claim 7, wherein:
the component comprises a surface oriented such that the first direction lies within a plane substantially parallel to the surface;
the surface includes a recess; and
the gas inlet is arranged within the recess.

9. The lithographic apparatus according to claim 8, wherein the gas outlet is provided on a surface of the component, the surface oriented such that the first direction lies within a plane substantially parallel to the surface and the gas outlet is provided on the same surface of the component as the recess in which the gas inlet is provided.

10. The lithographic apparatus according to claim 1, wherein:
the component comprises a surface oriented such that the first direction lies within a plane substantially parallel to the surface; and
the gas inlet is provided in the surface.

11. The lithographic apparatus according to claim 10, wherein the gas inlet includes a recess in the surface.

12. The lithographic apparatus according to claim 11, wherein the recess includes an inlet surface that joins the surface of the component at an end of the inlet that is the furthest part of the recess in the first direction and is at an angle to the surface of the component selected from the range of approximately 1° to approximately 15°.

13. The lithographic apparatus according to claim 11, wherein the width of the recess, measured in a direction that is perpendicular to the first direction and lies within the plane parallel to the surface of the component, increases in a direction opposite to the first direction.

14. The lithographic apparatus according to claim 1, wherein:
the component is also configured such that it can be moved in a second direction, opposite to the first direction, during use of the lithographic apparatus; and
the component includes a second passive gas flow system comprising:
a gas inlet configured such that, when the component moves in the second direction, the movement of the component in the second direction drives gas into the second passive gas flow system; and
a gas outlet, connected to the gas inlet by a gas conduit, configured to direct gas, that is driven into the second passive gas flow system by movement of the component in the second direction, in a certain direction relative to the component.

15. A device manufacturing method, comprising using a lithographic apparatus to transfer a pattern from a patterning device to a substrate, the method further comprising:
moving a component of the lithographic apparatus in a first direction, the component comprising a passive gas flow system;
as the component moves in the first direction in a non-vertical plane, driving gas, by virtue of the movement of the component, into the passive gas flow system via a gas inlet; and
passing the gas driven into the gas inlet through a gas conduit in the passive gas flow system to a gas outlet which directs the gas in a direction that is selected from the range of approximately perpendicular to the plane to approximately 10° to the first direction and to the plane.

16. A lithographic apparatus, comprising:
a component configured to be moved in at least a first direction during use of the lithographic apparatus, the component comprising a plate, arranged over a part of the component and arranged such that an outer surface and an inner surface of the plate are oriented such that the first direction lies within a plane parallel to the outer and inner surfaces, and the component including a passive gas flow system comprising:
a gas inlet configured such that, when the component moves in the first direction, the movement of the component in the first direction drives gas into the passive gas flow system, the gas inlet provided in the outer surface of the plate; and
a gas outlet, connected to the gas inlet by a gas conduit, configured to direct gas, that is driven into the passive gas flow system by the movement of the component in the first direction, in a certain direction relative to the component, the gas outlet provided in the inner surface of the plate and the gas conduit having an at least partly curved or diagonal surface.

17. The lithographic apparatus according to claim 16, wherein the gas conduit runs straight through the plate from the gas inlet to the gas outlet, and arranged such that the passive gas flow system provides a gas flow at an angle relative to the first direction selected from the range of approximately 185° to approximately 225°.

18. The lithographic apparatus according to claim 16, wherein the passive gas flow system is configured to provide a flow of gas towards a part of the component.

19. The lithographic apparatus according to claim 18, wherein the component is a moveable stage configured to support an object in the lithographic apparatus and the passive gas flow system is configured to provide a flow of gas towards an actuator.

* * * * *